(12) United States Patent
Mellot et al.

(10) Patent No.: US 10,304,877 B2
(45) Date of Patent: *May 28, 2019

(54) CIRCUIT AND METHOD FOR CONTROLLING AND SELECTIVELY ENABLING PHOTODIODE CELLS

(71) Applicants: STMicroelectronics (Grenoble 2) SAS, Grenoble (FR); STMicroelectronics (Research & Development) Limited, Marlow (GB)

(72) Inventors: Pascal Mellot, Lans en Vercors (FR); Stuart McLeod, Edinburgh (GB); Bruce Rae, Edinburgh (GB); Marc Drader, Colombelles (FR)

(73) Assignees: STMicroelectronics (Research & Development) Limited, Marlow Bucks (GB); STMicroelectronics (Grenoble 2) SAS, Grenoble (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/709,791

(22) Filed: Sep. 20, 2017

(65) Prior Publication Data

US 2018/0026058 A1 Jan. 25, 2018

Related U.S. Application Data

(63) Continuation of application No. 14/926,454, filed on Oct. 29, 2015, now Pat. No. 9,786,701.

(30) Foreign Application Priority Data

Mar. 23, 2015 (FR) ...................................... 15 52385

(51) Int. Cl.
H01L 31/107 (2006.01)
H01L 27/144 (2006.01)
(Continued)

(52) U.S. Cl.
CPC ........ *H01L 27/1443* (2013.01); *G01S 7/4863* (2013.01); *G01S 7/4865* (2013.01);
(Continued)

(58) Field of Classification Search
CPC ............... H01L 31/107; H01L 27/1446; H01L 31/02027; G01J 2001/442; G01J 2001/4466
(Continued)

(56) References Cited

U.S. PATENT DOCUMENTS 7,262,402 B2  8/2007  Niclass et al.
7,858,917 B2 * 12/2010  Stern ..................... G01T 1/2928
                                                          250/208.1
(Continued)

FOREIGN PATENT DOCUMENTS

GB    2509545 A     7/2014
WO   2014202995 A1  12/2014

*Primary Examiner* — Que Tan Le
(74) *Attorney, Agent, or Firm* — Slater Matsil, LLP

(57) ABSTRACT

A circuit may include an array of single photon avalanche diode (SPAD) cells, each SPAD cell configured to be selectively enabled by an activation signal. The circuit may include a control circuit configured to selectively enable a subset of the array of SPAD cells based on a measured count rate of the array of SPAD cells.

21 Claims, 3 Drawing Sheets

(51) Int. Cl.
  *G01S 7/486* (2006.01)
  *G01S 7/497* (2006.01)
  *H01L 31/0216* (2014.01)
  *H01L 27/146* (2006.01)
  *H01L 27/148* (2006.01)

(52) U.S. Cl.
  CPC .......... *G01S 7/497* (2013.01); *H01L 27/1446* (2013.01); *H01L 27/14623* (2013.01); *H01L 27/14818* (2013.01); *H01L 31/02164* (2013.01); *H01L 31/107* (2013.01)

(58) Field of Classification Search
  USPC ..................................................... 250/214 R
  See application file for complete search history.

(56) References Cited

U.S. PATENT DOCUMENTS

| | | |
|---|---|---|
| 8,610,043 B2 | 12/2013 | Baxter |
| 2006/0192086 A1 | 8/2006 | Niclass et al. |
| 2006/0202129 A1 | 9/2006 | Niclass et al. |

* cited by examiner

CIRCUIT AND METHOD FOR CONTROLLING AND SELECTIVELY ENABLING PHOTODIODE CELLS

CROSS-REFERENCE TO RELATED APPLICATIONS

This application is continuation of U.S. patent application Ser. No. 14/926,454, filed on Oct. 29, 2015, which claims priority to French Application No. 1552385, filed on Mar. 23, 2015, which applications are hereby incorporated herein by reference.

TECHNICAL FIELD

The present disclosure relates to the field of single photon avalanche diode (SPAD) arrays, and in particular to, a circuit and method for controlling a SPAD array.

BACKGROUND

SPAD arrays can be used for a variety of applications, including for ranging, for Z (i.e. depth) or three-dimensional (3D) gesture recognition, and for 3D imaging. A device for such applications generally comprises a light source for transmitting a light pulse into the image scene. The light reflected back from any object in the image scene is detected by the SPAD array, and is used to determine the time of flight of the light pulse. The distance from object to the device can then be deduced based on this time of flight.

The detection by the SPAD array of the returning light pulse is based on event detection in the cells of the SPAD array. In particular, each cell will provide an output pulse when a photon is detected, and by monitoring the events, the arrival time of the return pulse can be estimated.

The total number of events detected by the SPAD array within a given time period will vary as a function of factors, such as the ambient light, the target reflectance, the emitted power, the SPAD sensitivity, and the distance to the target object. A problem may be that, when the number of detected events is high, the measurement accuracy of the SPAD array can deteriorate.

SUMMARY

Generally speaking, a circuit may include an array of SPAD cells, each SPAD cell configured to be selectively enabled by an activation signal. The circuit may include a control circuit configured to selectively enable a subset of the array of SPAD cells based on a measured count rate of the array of SPAD cells.

DETAILED DESCRIPTION OF ILLUSTRATIVE EMBODIMENTS

Figure 1:
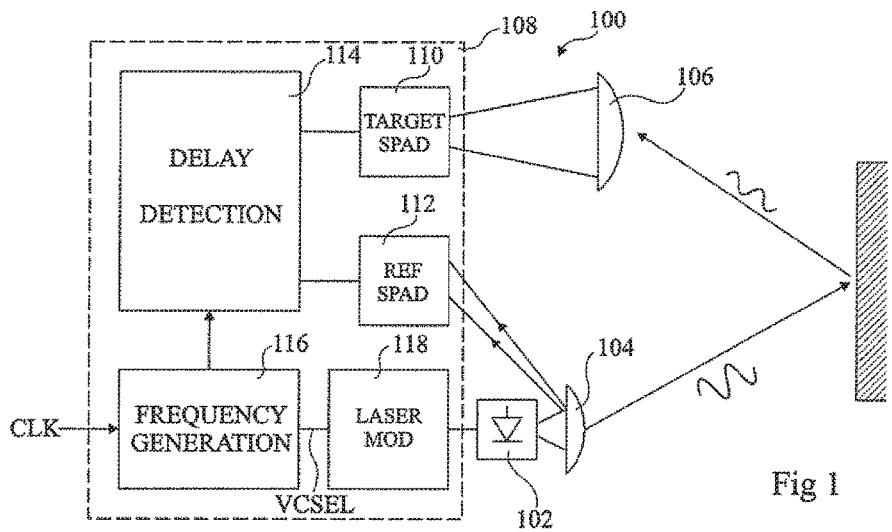
FIG. 1 is a schematic diagram of a SPAD device, according to an example embodiment of the present disclosure.

Throughout the present description, the term "connected" is used to designate a direct electrical connection between two elements, whereas the term "coupled" is used to designate an electrical connection between two elements that may be direct, or may be via one or more other components such as resistors, capacitors or transistors. Furthermore, as used herein, the term "substantially" is used to designate a range of +/−10 percent of the value in question. It is an aim of embodiments of the present description to at least partially address one or more problems in the prior art.

Generally speaking, a circuit may include an array of SPAD cells, each SPAD cell being selectively enabled by an activation signal, and a control circuit adapted to selectively enable only a subset of the SPAD cells of the array based on a measured count rate of the SPAD array. Also, at least one first cell of the SPAD array may have a photosensitive zone at least partially shielded by a shield such that the at least one first cell has a lower sensitivity than the other cells of the SPAD array.

Additionally, the shield may have an opening with an area equal to between 5% and 90% of the area of the photosensitive zone. The enabled subset of SPAD cells may comprise the at least one first cell. The measured count rate may be the highest of a plurality of measured count rates. The circuit may further comprise a light source, and the control circuit may comprise an adder for generating the measured count rate by adding an ambient rate measured while the light source is disabled to a further rate measured while the light source is enabled.

Moreover, the control circuit may be adapted to determine, based on the measured count rate, a first value indicating the number of SPAD cells of the array to form the first subset of enabled cells. The control circuit may be adapted to compare the first value with a threshold value and to selectively enable the at least one first cell of the SPAD array based on the comparison.

The circuit may further include a count circuit comprising one or more counters adapted to count events detected by each enabled cell of the SPAD array during a count window. The cells of the SPAD array may be disabled during a deadtime between detection phases, and the control circuit may be adapted to generate the threshold value based on the duration of the deadtime period.

The SPAD array may comprise at least first, second and third subsets of cells. The control circuit may be adapted to generate a first enable signal for selectively enabling the cells of the first subset and a second enable signal for selectively enabling the cells of the second subset. Each cell of the SPAD array may comprise a first transistor having main conducting nodes coupled between an output node of the cell and a first supply voltage rail, and a control node being controlled based on the activating signal.

Each cell of the SPAD array may comprise an avalanche diode, and a second transistor having main conducting nodes coupled between a node of the avalanche diode and a second supply voltage rail, and a control node being controlled based on the activating signal. A method may include selectively enabling, by a control circuit, only a subset of the cells of an array of SPAD (single photon avalanche diode) cells based on a measured count rate of the SPAD array.

FIG. 1 illustrates a SPAD device 100, which is, for example, a ranging device, Z or 3D gesture recognition device, or 3D imaging device. The device 100 comprises a light source 102, which is, for example, a laser, for generating a beam of light pulses transmitted into the image scene, for example, via a lens 104. The return light pulses are, for example, received via a further lens 106.

The SPAD device further comprises a detection circuit 108 for determining the distance between the device 100 and an object in the image scene, against which the light pulses reflect. The detection circuit 108, for example, comprises a target SPAD array (TARGET SPAD) 110, which receives the return light pulses via the lens 106. The target SPAD array 110, for example, comprises an array of between 4 and several hundred SPAD cells. In one example, the array is a 12 by 12 array comprising 144 SPAD cells.

The detection circuit 108 also, for example, comprises a reference SPAD array (REF SPAD) 112, which is, for example, of the same dimensions as the target SPAD array 110, and receives an internal reflection of the transmitted light pulses. A delay detection circuit (DELAY DETECTION) 114 is, for example, coupled to the target SPAD array no and to the reference SPAD array 112, and estimates the delay between each transmitted light pulse and the return light pulse received by the target SPAD array 110. The detection circuit 108 also, for example, comprises a frequency generation circuit (FREQUENCY GENERATION) 116, which generates a voltage signal VCSEL provided to a laser modulation circuit (LASER MOD) 118 for generating a signal for driving the light source 102.

Figure 2:
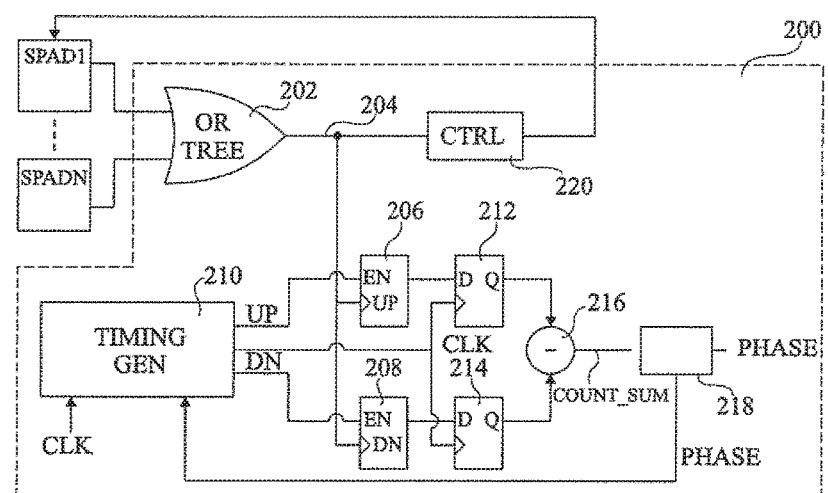
FIG. 2 is a schematic diagram of a delay detection circuit of FIG. 1 in more detail, according to an example embodiment.

FIG. 2 includes a circuit 200 forming part of the delay detection circuit 114 of FIG. 1 according to an example embodiment. The circuit 200 receives signals from the cells of the target SPAD array 110. A similar circuit is, for example, provided for receiving the signals from the cells of the reference SPAD array 112.

The circuit 200, for example, comprises an OR tree (OR TREE) 202 having inputs respectively coupled to each of the SPAD cells SPADi to SPADN of the array 110, and providing, on its output line 204, pulses generated each time an event is detected by one of the SPAD cells. The output line 204 is coupled to counters for counting the detected events. In the example of FIG. 2, the output line is coupled to the clock input of an up counter (UP) 206 and of a down counter (DN) 208. The up counter 206 is enabled during an up count period, based on a signal UP received from a timing generation circuit (TIMING GEN) 210, which receives a clock signal CLK. Similarly, the down counter 208 is enabled during a down count period, based on a signal DN received from the timing generation circuit 210. The output of the counter 206 is, for example, clocked by a flip-flop 212 based on the clock signal CLK, and the output of the counter 208 is, for example, clocked by a flip-flop 214 based on the clock signal CLK. A difference between the outputs of the flip-flops 212 and 214 is generated by a subtraction unit 216 to provide a signal COUNT_SUM. This signal is analyzed by an analysis circuit 218 in order to determine the timing to be applied by the timing generation circuit 210.

The circuit 200, for example, further comprises a control circuit (CTRL) 220 adapted to enable only a subset of the SPAD cells of the SPAD array no based on a measured count rate of the array. For example, the count rate is determined by counting, during successive periods, events on the line 204 at the output of the OR tree.

Figure 3:
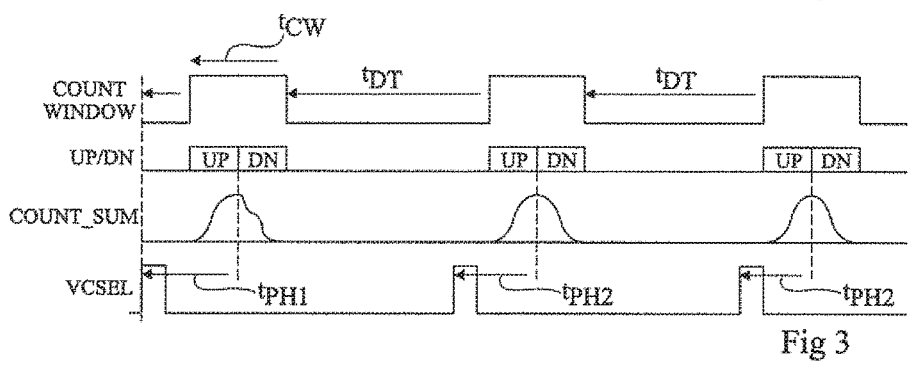
FIG. 3 is a timing diagram illustrating examples of signals in the circuit of FIG. 2.

FIG. 3 illustrates a count window (COUNT WINDOW) of the counters 206, 208 of FIG. 2, and the signal UP and DN controlling the counters 206, 208, the signal COUNT_SUM and the signal VCSEL used to generate the optical pulses. The count window for each detection phase, for example, has a duration tCW, and the count windows are separated by deadtime periods of duration tDT during which the counters 206, 208 are disabled. The signal UP is, for example, asserted during the first half of the count window, and the signal DN is, for example, asserted during the second half of the count window.

In particular, the signal VCSEL is, for example, the signal used to generate the transmitted light pulses, and thus a time difference between this pulse and the center of the count window, averaged over several detection phases, can be used to determine a first time delay between VCSEL and the return light pulse. In a similar fashion, a second time delay between VCSEL and the reference pulse is, for example, calculated. The difference between the first and second time delays is, for example, determined in order to estimate the time of flight.

The circuit of FIG. 2 provides one particular example implementation of a detection circuit for a SPAD array. It will however be apparent to those skilled in the art that the principles of the SPAD array control method described herein after could be applied to different types of SPAD detection circuits.

Figure 4:
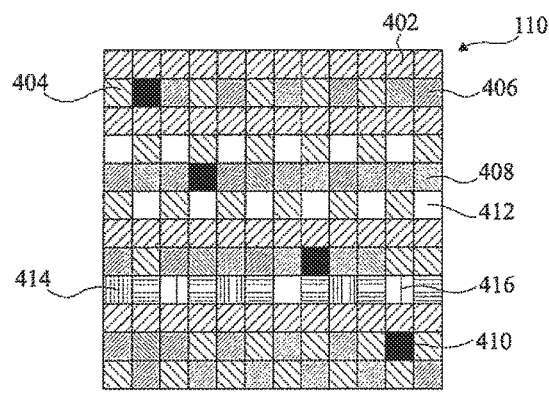
FIG. 4 is a schematic diagram of a SPAD array comprising subsets of cells, according to an example embodiment.

FIG. 4 schematically illustrates the SPAD array no according to an example embodiment, in an example in which it comprises a 12 by 12 array of SPAD cells. The array 110 is, for example, divided into a plurality of subsets of SPAD cells. In the example of FIG. 4, the array is divided into a set of 64 cells 402 shown with a first type of hatching, a set of 31 cells 404 shown with a second type of hatching, a set of 14 cells 406 shown with a third type of hatching, a set of 7 cells 408 shown with a fourth type of hatching, a set of 4 cells 410 shown with a fifth type of hatching, a set of 12 cells 412 shown with a sixth type of hatching, a set of 6 cells 414 shown with a seventh type of hatching, and a set of 6 cells 416 shown with an eighth type of hatching.

In one example, the cells 412, 414 and 416 all have reduced sensitivity compared to the other cells of the array. For example, these cells have a shield formed over them at least partially restricting the exposure of the photosensitive zone of the SPAD cells to the image scene. The shields are, for example, annular, or could have another form comprising an opening providing an aperture. In one embodiment, these cells have the area of their sensitive zone reduced by a factor of substantially 7.5 with respect to the other cells of the array. Some or all of the SPAD cells of the SPAD array no are capable of being selectively and individually enabled, as will now be described with reference to the example of FIG. 5.

Figure 5:
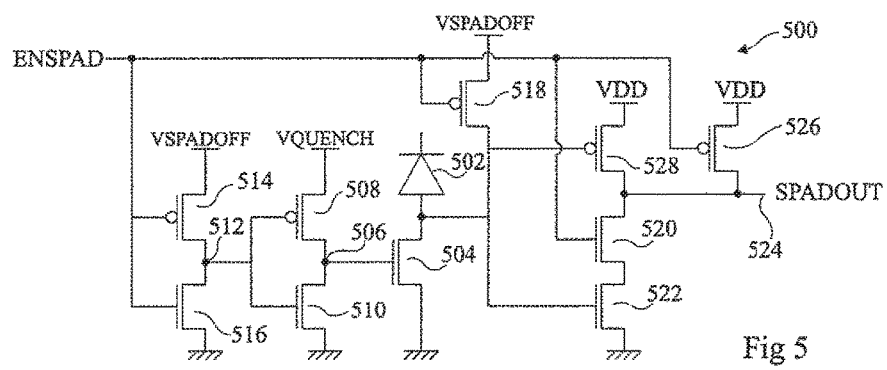
FIG. 5 is a schematic diagram of the circuit of a SPAD cell, according to an example embodiment.

FIG. 5 shows the circuit of a SPAD cell 500 according to an example embodiment. Each of the cells of the target SPAD array 110 is, for example, implemented by a similar circuit. A photodiode 502 has its anode coupled to ground via the main conducting nodes of an NMOS transistor 504. The gate of transistor 504 is, for example, coupled to a node 506 at the output of an inverter formed by a PMOS transistor 508 and an NMOS transistor 510. The PMOS transistor 508, for example, has its source coupled to a supply voltage rail at a voltage level VQUENCH, which is, for example, equal to around 1.8 V. The gates of the transistors 508, 510 are, for example, coupled to an output node 512 of a further inverter formed of a PMOS transistor 514 and an NMOS transistor 516. The PMOS transistor 514, for example, has its source coupled to a supply voltage rail at a voltage level VSPAD-OFF, which when activated is at around the same level as VQUENCH. The gates of transistors 514, 516 are coupled to receive the SPAD activation signal ENSPAD.

The anode of the photodiode 502 is also, for example, coupled to the voltage level VSPADOFF via a PMOS transistor 518, and to one input of a NAND gate. The other input of the NAND gate is coupled to receive the activation signal ENSPAD. The NAND gate, for example, comprises a pair of NMOS transistors 520, 522 coupled in series via their main conducting nodes between an output node 524 of the SPAD cell and ground, and having their gates respectively coupled to the line receiving the activation signal ENSPAD and to the photodiode 502. The NAND gate further comprises a pair of PMOS transistors 526, 528 coupled in parallel with each other between the output node 524 and the supply voltage VDD, and having their gates respectively coupled to the line receiving the activation signal ENSPAD and to the photodiode 502. Thus, if the activation signal ENSPAD is at a logic high level, the transistor 504 will receive the voltage signal VQUENCH at its gate, and the NAND gate will become an inverter amplifying the signal from the photodiode. Alternatively, if the activation signal ENSPAD is at a logic low level, then the output signal of the SPAD cell will be at the supply voltage VDD, and the photodiode 502 will have its anode coupled to the voltage rail VSPADOFF. Of course, FIG. 5 is merely one example, and many different circuit arrangements would be possible for implementing each SPAD cell.

Figure 6A:
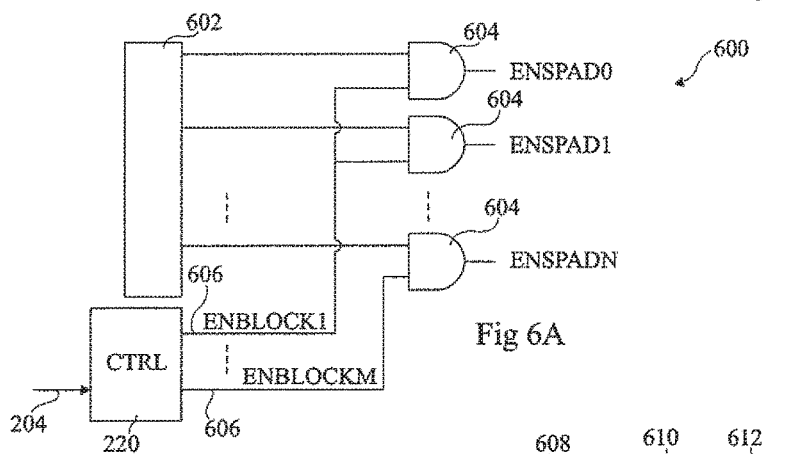
FIG. 6A is a schematic diagram of a circuit for generating activation signals for the SPAD cells of a SPAD array, according to an example embodiment.

FIG. 6A shows an example of a selection circuit 600 for selectively enabling one or more subsets of the SPAD cells forming the target SPAD array 110. For example, the circuit 600 comprises a register 602 storing a binary value associated with each SPAD cell indicating whether this cell is correctly functioning. Any faulty cells are, for example, permanently disabled by the corresponding value stored in the register 602. Furthermore, an AND gate 604 is provided for each SPAD cell of the array. The AND gates 604 respectively provide activation signals ENSPADo to ENSPADN. Each AND gate 604 has one of its inputs coupled to a corresponding output of the register 602, and the other of its inputs coupled to one of a plurality of output lines 606 of the control circuit 220. In particular, there are, for example, M output lines 606, respectively providing block enable signals ENBLOCKi to ENBLOCKM. Each of these signals is, for example, coupled to the AND gates 604 corresponding to a different subset of the SPAD cells of the array. For example, referring to the example of FIG. 4, the line 606 with the signal ENBLOCK1 is, for example, coupled to the cells 402, the line 606 with the signal ENBLOCK2 is coupled to the cells 404, and so on and so forth, up to the line 606, with the signal ENBLOCKM, which is, for example, coupled to the cells 416. In operation, the control circuit 220, for example, asserts one or more of the signals ENBLOCK1 to ENBLOCKM based on a count rate value determined based on the events present on the line 204 at the output of the OR tree 202 of the SPAD array of FIG. 2.

Figure 6B:
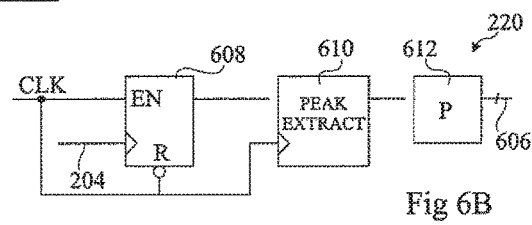
FIG. 6B is a schematic diagram of a control circuit of FIG. 6A in more detail.

FIG. 6B schematically illustrates an example implementation of the control circuit 220 of FIG. 6A in more detail according to an example embodiment. The line 204 at the output of the OR tree 202 of the SPAD array no is, for example, coupled to the clock input of a counter 608, which is enabled and reset by a further clock signal CLK. The output of the counter 608 is, for example, provided to a peak value extraction circuit 610, which is, for example, clocked by the clock signal CLK, and determines the peak count rate by storing the highest count value provided by the counter 608 over several cycles of a detection phase. In some embodiments, the circuit 610 provides a rate VCSEL_RATE corresponding to the peak count value while the optical pulses are active, and also an ambient rate AMBIENT_RATE corresponding to the count rate while the light source 102 is disabled.

The measured count rates from the circuit 610 are, for example, provided to a processing circuit 612, which generates the signals on the lines 606 based on the measured count rates. Rather than being provided by the elements 608 and 610, the count rates could alternatively be provided by a counter placed in parallel with the UP and DN counters 206, 208, which accumulates the events on the line 204 over time. As yet a further example, the count rates could be calculated using a counter per SPAD.

Figure 7A:
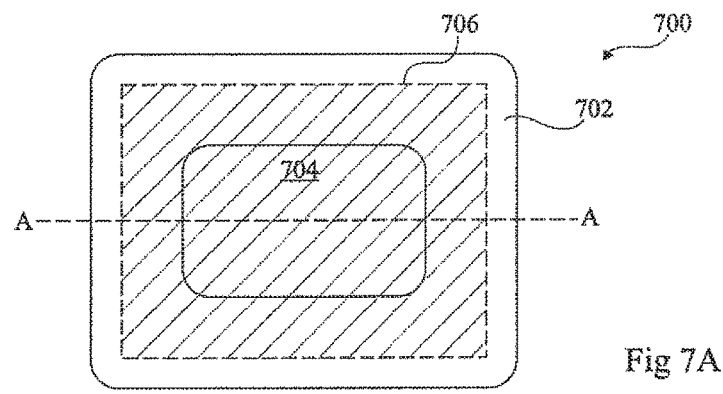
FIG. 7A is a top plan view of a SPAD cell with an annular shield, according to an example embodiment.

FIG. 7A is a SPAD cell 700 having an annular shield 702 for reducing its sensitivity. The annular shield 702 is, for example, in the form of a light blocking plate having an opening 704 forming an aperture. A photosensitive zone of the SPAD cell is represented by a dashed rectangle 706 in FIG. 7A, and the opening 704, for example, exposes a sub-portion of the photosensitive zone such that the sensitivity of the SPAD cell is reduced. For example, the photosensitive area exposed by the opening 704 has an area corresponding to between 5% and 90% of the area of the photosensitive zone 706.

Figure 7B:
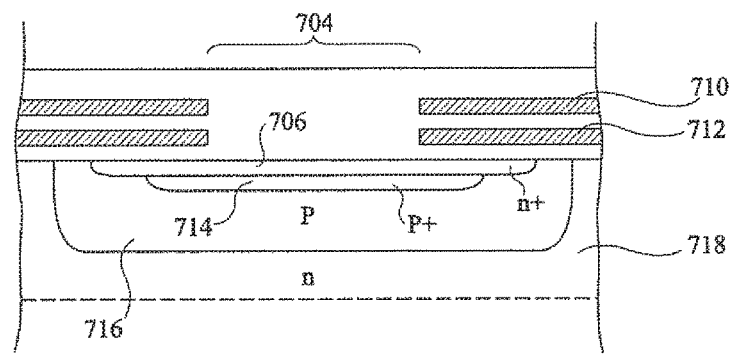
FIG. 7B is a cross-section view of the SPAD cell of FIG. 7A taken along a dashed line A-A in FIG. 7A.

As illustrated in FIG. 7B, the annular shield is, for example, formed in at least two metal layers 710, 712 of the device, for example, separated by oxide layers. The aperture 704 is, for example, also filled with oxide. The photosensitive zone 706, for example, comprises a heavily doped n-type layer (n+). A heavily doped p-type layer (p+) is, for example, formed underlying at least a portion of the n-type layer 706. The doped layers 706 and 714 are, for example, formed in a p-type well 716, which is in turn, for example, formed in an n-type substrate 718. The silicon structure of FIG. 7B is merely one example, and it will be apparent to those skilled in the art that many variations to this structure would be possible.

Figure 8:
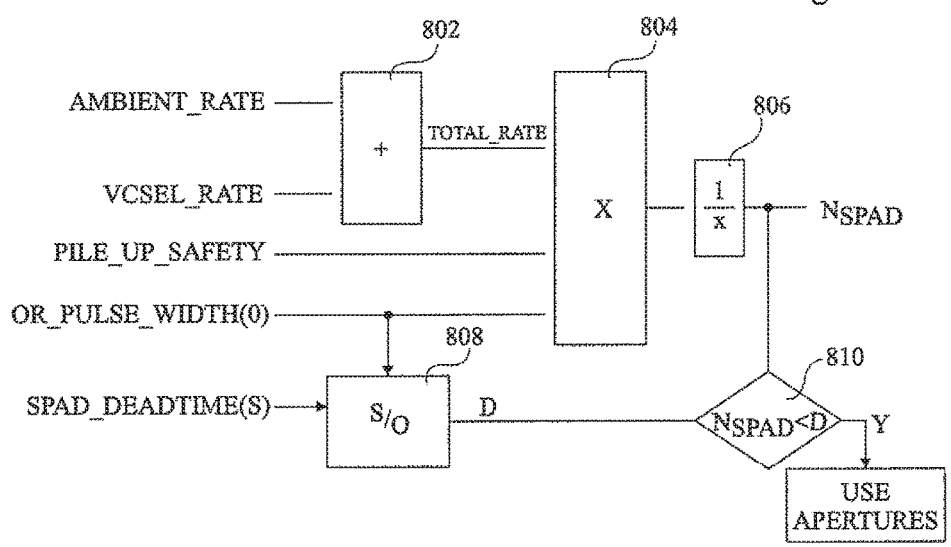
FIG. 8 is a flowchart representing a method for determining a number of SPAD cells of a SPAD array to be enabled, according to an example embodiment of the present disclosure.

FIG. 8 is a flowchart illustrating an example of a method implemented by the processing circuit 612 of FIG. 6 for determining a number of SPAD cells to be enabled, and for optionally determining whether or not one or more shielded SPAD cells should be enabled. This method is, for example, implemented in hardware, or by software running on a processor.

The method of FIG. 8 is, for example, based one or more count rate measurements for the SPAD array. For example, an ambient rate (AMBIENT_RATE) and a rate with the optical pulses activated (VCSEL_RATE) are both provided as inputs, and added together by an addition operation 802 to provide a total count rate (TOTAL_RATE). The rate VCSEL_RATE is, for example, a peak rate. The ambient rate AMBIENT_RATE is, for example, determined by counting events only occurring outside of the count window. The rate VCSEL_RATE is, for example, determined by counting events only occurring during the count window. In some embodiments, the total count rate is converted into a count rate per SPAD cell by dividing the value by the number of activated SPAD cells.

The total count rate value is, for example, then multiplied by one or more other parameters by a multiplication operation 804. For example, the total rate is multiplied by a parameter labeled PILE_UP_SAFETY, which indicates a ratio between the maximum count rate of the SPAD array and the desired maximum count rate to prevent pile up in the detection circuit. For example, this parameter is chosen to be in the range of 10 to 40, and is, for example, substantially equal to 20. Additionally or alternatively, the total rate is, for example, multiplied by the width of the OR pulse, labeled OR_PULSE_WIDTH(O) in FIG. 8, which corresponds to the width of the digital pulse at the output of the OR tree provided to the counters that ensures that the counters will not miss the event. This parameter is, for example, in the range 1 to 10 ns, and, for example, substantially equal to 1.8 ns in one example.

The reciprocal of the output of the multiplication operation is, for example, calculated by an operation 806, and the result, for example, indicates a number NSPAD of SPAD cells to be activated. As a typical example, taking the ambient rate to equal 1 Mcps (million counts per second) and the VCSEL rate to be equal to 2.5 Mcps, a pile up safety value of 20, and an OR pulse width of 1.8 ns, the value NSPAD would be determined as 7.93. One or more subsets of SPAD cells having a number of cells lower than NSPAD is, for example, selected. Therefore, taking the example of the SPAD array 110 of FIG. 4, the seven SPAD cells 408 are, for example, activated in this example. Additionally, six aperture SPAD cells may also be activated.

The method of FIG. 8 also, for example, involves a determination of whether or not SPAD cells with restricted apertures should be employed. This is, for example, the case if the count rate per SPAD exceeds a certain limit. For example, a threshold D is determined by a division operation 808 based on the ratio between the SPAD deadtime and the OR pulse width. For example, in the case that the SPAD deadtime is equal to 10 ns and the OR pulse width is equal to 1.8 ns, the threshold D is equal to 5.5. The value NSPAD is compared to the threshold D in an operation 810. Thus, if NSPAD is lower than 5.5, one or more SPAD cells with annular shields will, for example, be employed to prevent the individual cells from being overexposed.

As an example, assuming that the ambient rate is equal to 3 Mcps and the VCSEL rate is equal to 4 Mcps, NSPAD is, for example, determined to equal to 3.97. In such a case, the 24 cells 412, 414 and 916 having a reduced aperture are, for example, enabled. Indeed, each of these cells, for example, has a sensitivity equal to 1/7.5 that of a normal cell, and thus the sensitivity of the 24 cells will correspond to 3.2 standard SPAD cells.

It will be apparent to those skilled in the art that the method of FIG. 8 is merely one particular example, and that many variations to this method would be possible. For example, rather than calculating a total count rate equal to the sum of the ambient and VCSEL rates, the method could be based on only one of these rates. Furthermore, the value of NSPAD could simply be calculated by a single division operation of a fixed parameter divided by the count rate value. Furthermore, in some embodiments, the threshold D could be a fixed parameter in the system programmed by a user.

An advantage of the embodiments described herein is that, by selectively enabling only a subset of the SPAD cells of a SPAD array, the sensitivity of the SPAD array can be improved by preventing an overly high count rate that is likely to lead to events being missed, or photon arrival statistics being skewed. Furthermore, by providing one or more SPAD cells having a reduced aperture, and thus reduced sensitivity, it is possible to avoid a maximum count rate per cell being exceeded. Having thus described at least one illustrative embodiment, various alterations, modifications and improvements will readily occur to those skilled in the art.

For example, it will be apparent to those skilled in the art that embodiments have been described based on metal-oxide semiconductor (MOS) transistors, alternative embodiments could at least partially be based on other transistor technologies such as bipolar technology. Furthermore, it will be apparent to those skilled in the art how the positive supply rail and ground rail in the various embodiments could be exchanged with each other, and that rather than a ground voltage, a different supply voltage level could be used, such as a negative voltage. Furthermore, it will be apparent to those skilled in the art that the various features described in relation to the various embodiments could be combined, in alternative embodiments, in any combination.

What is claimed is:

1. A circuit comprising:
   a plurality of photodiode cells, each photodiode cell having an enable input and an output;
   a first circuit having a plurality of inputs, each input of the first circuit coupled to the respective output of each photodiode cell of the plurality of photodiode cells; and
   a controller having an input coupled to the output of the first circuit and a plurality of outputs, each output of the controller coupled to the respective enable input of each photodiode cell of the plurality of photodiode cells, the controller configured to selectively enable a subset of the plurality of photodiode cells based on the output of the first circuit.

2. The circuit of claim 1, wherein each photodiode cell comprises an avalanche diode.

3. The circuit of claim 2, wherein the first circuit comprises an OR gate.

4. The circuit of claim 2, wherein each photodiode cell comprises a first, second, third and fourth transistors, the first transistor coupled between a ground terminal and an anode of the avalanche diode, the anode of the avalanche diode further coupled to a first supply terminal via the second transistor and to a gate of the third transistor, the third transistor coupled to the output of the photodiode cell via the fourth transistor.

5. The circuit of claim 4, wherein the enable input of each photodiode cell of the plurality of photodiode cells is coupled to a gate of the respective fourth transistor and to a gate of the respective first transistor via a respective first inverter in series with a respective second inverter, wherein the first inverter is coupled to the first supply terminal and the second inverter is coupled to a second supply terminal.

6. A method comprising:
   receiving outputs of each single photon avalanche diode (SPAD) cell of a plurality of SPAD cells;
   generating an output signal based on the received outputs of each SPAD cell; and
   selectively enabling a subset of the plurality of SPAD cells based on the generated output signal, wherein a first SPAD cell of the plurality of SPAD has lower sensitivity than a second SPAD cell of the plurality of SPAD cells.

7. The method of claim 6, further comprising permanently disabling faulty SPAD cells of the plurality of SPAD cells.

8. The method of claim 6, further comprising:
  determining an ambient count rate count based on the generated output signal when a light source are is disabled; and
  determining a peak count rate based on the generated output signal when optical pulses are produced by the light source.

9. The method of claim 8, wherein selectively enabling the subset of the plurality of SPAD cells is based on the ambient count rate and on the peak count rate.

10. A single photon avalanche diode (SPAD) device comprising:
  a light source;
  a target array of target SPAD cells, each target SPAD cell having an enable input and an output; and
  a first circuit comprising
    a second circuit having a plurality of inputs, each input of the first circuit coupled to the respective output of each target SPAD cell, and
    a first control circuit having an input coupled to the output of the second circuit and a plurality of outputs, each output of the first control circuit coupled to the respective enable input of each target SPAD cell, the first control circuit configured to selectively enable a subset of the target SPAD cells of the target array of target SPAD cells based on the output of the second circuit.

11. The SPAD device of claim 10, further comprising:
  a reference array of reference SPAD cells, each reference SPAD cell having an enable input and an output;
  a third circuit having a plurality of inputs, each input of the third circuit coupled to the respective output of each reference SPAD cell; and
  a second control circuit having an input coupled to the output of the third circuit and a plurality of outputs, each output of the second control circuit coupled to the respective enable input of each reference SPAD cell, the second control circuit configured to selectively enable a subset of the reference SPAD cells of the reference array of reference SPAD cells based on the output of the third circuit.

12. The SPAD device of claim 10, wherein the light source comprises a laser.

13. The SPAD device of claim 10, wherein the target array has the same size as the reference array.

14. The SPAD device of claim 10, further comprising a first lens coupled between the light source and an image scene; and a second lens coupled between the image scene and the target array.

15. A circuit comprising an array of single photon avalanche diode (SPAD) cells, each SPAD cell of the array of SPAD cells having an enable input and an output, the array of SPAD cells having a first subset of SPAD cells and a second subset of SPAD cells, the second subset of SPAD cells being non-overlapping with the first subset of SPAD cells, wherein each SPAD cell of the first subset of SPAD cells comprises a shield and a photosensitive zone at least partially covered by the shield, the SPAD cells of the first subset of SPAD cells having a lower sensitivity to light than SPAD cells of the second subset of SPAD cells.

16. The circuit of claim 15, wherein each shield of the SPAD cells of the first subset of SPAD cells cover between 10% and 95% of the respective photosensitive zone.

17. The circuit of claim 16, wherein each SPAD cell of the first subset of SPAD cells has a sensitivity to light equal to 1/7.5 of the sensitivity to light of a SPAD cell of the second subset of SPAD cells.

18. The circuit of claim 16, wherein each shield of the SPAD cells of the first subset of SPAD cells has an annular form.

19. The circuit of claim 16, wherein each shield of the SPAD cells of the first subset of SPAD cells comprises two metal layers separated by an oxide layer.

20. The circuit of claim 15, further comprising a controller having a plurality of outputs, each output of the controller coupled to the respective enable input of each SPAD cell of the array of SPAD cells, the controller configured to selectively enable a subset of SPAD cells of the array of SPAD cells based on light intensity received by the array of SPAD cells.

21. The circuit of claim 20, further comprising a first circuit having a plurality of inputs and an output, each input of the first circuit coupled to the respective output of each SPAD cell of the array of SPAD cells, wherein the controller further comprises an input coupled to the output of the first circuit, and the controller is configured to determine the light intensity received by the array of SPAD cells based on the output of the first circuit.

* * * * *